(12) United States Patent
Bogen et al.

(10) Patent No.: US 11,533,822 B2
(45) Date of Patent: Dec. 20, 2022

(54) POWER ELECTRONICS SUBMODULE FOR MOUNTING ON A COOLING DEVICE

(71) Applicant: SEMIKRON ELEKTRONIK GMBH & CO. KG, Nuremberg (DE)

(72) Inventors: Ingo Bogen, Nuremberg (DE); Alexander Wehner, Nuremberg (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 160 days.

(21) Appl. No.: 17/174,801

(22) Filed: Feb. 12, 2021

(65) Prior Publication Data

US 2021/0267086 A1 Aug. 26, 2021

(30) Foreign Application Priority Data

Feb. 24, 2020 (DE) .................. 10 2020 104 723.1

(51) Int. Cl.
| | |
|---|---|
| *H05K 7/20* | (2006.01) |
| *H01L 23/02* | (2006.01) |
| *H05K 5/02* | (2006.01) |
| *H01L 23/36* | (2006.01) |
| *H01L 23/12* | (2006.01) |

(52) U.S. Cl.
CPC ............. *H05K 7/20* (2013.01); *H01L 23/02* (2013.01); *H01L 23/12* (2013.01); *H01L 23/36* (2013.01); *H05K 5/02* (2013.01)

(58) Field of Classification Search
None
See application file for complete search history.

(56) References Cited

U.S. PATENT DOCUMENTS

2011/0069458 A1* 3/2011 Nakao .................. H01L 25/072
361/728

FOREIGN PATENT DOCUMENTS

| DE | 102018204473 A1 | 12/2018 |
| DE | 102017115883 A1 | 1/2019 |
| JP | 09055462 A | 2/1997 |

\* cited by examiner

*Primary Examiner* — Mukundbhai G Patel
(74) *Attorney, Agent, or Firm* — Andrew F. Young; Nolte Lackenbach Siegel

(57) ABSTRACT

A power electronics submodule for mounting on a cooling device, has first and second surface sections next to one another, a substrate with a housing and includes a connection element, conductively connected by a contact to a track of the substrate and a connection section, arranged parallel to the substrate, the substrate arranged on the first surface section, the housing has a housing section, with a first main surface, arranged on the second surface section, and a second main surface, situated opposite the first main surface. In a non-mounted state a first main surface of the connection section is a first distance from the second main surface of the housing section in the housing region of a fastening device.

11 Claims, 5 Drawing Sheets

POWER ELECTRONICS SUBMODULE FOR MOUNTING ON A COOLING DEVICE

CROSS REFERENCE TO RELATED APPLICATIONS

This application relates to, and claims priority from, German Ser. No.: DE 10 2020 104 723.1 filed on Feb. 24, 2021, the entire contents of which are incorporated herein by reference.

FIGURE SELECTED FOR PUBLICATION

FIG. 3

BACKGROUND OF THE INVENTION

Field of the Invention

The invention describes a power electronics submodule for mounting on a cooling device, which has a first and a second surface section which are arranged next to one another, comprising a substrate, comprising a housing and comprising a connection element, which is electrically conductively connected by way of a contact section to a conductor track of the substrate and has a connection section, wherein the substrate is intended to be arranged by way of a first main surface on the first surface section. The invention furthermore describes a method for arranging a submodule of this kind on a cooling device.

Description of the Related Art

DE 10 2017 115 883 A1 discloses, a submodule and an arrangement comprising the said submodule, wherein the submodule has a switching device comprising a substrate and conductor tracks arranged thereon. The submodule has a first and a second DC voltage conductor track and, electrically conductively connected thereto, a first and a second DC voltage connection element and also an AC voltage conductor track and, electrically conductively connected thereto, an AC voltage connection element. The submodule furthermore has a shaped insulating material body, which encloses the switching device in a frame-like manner. Here, the first DC voltage connection element rests by way of a first contact section on a first support body of the shaped insulating material body and the AC voltage connection element rests by way of a second contact section on a second support body of the shaped insulating material body. A first clamping device is designed to extend through a first clearance of the first support body in an electrically insulated manner and to form an electrically conductive clamping connection between the first DC voltage connection element and an associated first DC voltage connecting element, and a second clamping device is designed to extend through a second clearance of the second support body in an electrically insulated manner and to form an electrically conductive clamping connection between the AC voltage connection element and an associated AC voltage connecting element.

ASPECTS AND SUMMARY OF THE INVENTION

The invention is based on the object of presenting a power electronics submodule of the abovementioned generic type, wherein the thermal connection of the substrate to a cooling device in the region of the connection of a contact section of a connection element to a conductor track of the substrate is improved.

According to one aspect of the present invention, there is provided a power electronics submodule for mounting on a cooling device, which has a first and a second surface section which are arranged next to one another, comprising a substrate, comprising a housing and comprising a connection element, which is electrically conductively connected by way of a contact section to a conductor track of the substrate and has a connection section, which is arranged parallel to the substrate, wherein the substrate is intended to be arranged by way of a first main surface on the first surface section, wherein the housing has a housing section, which has a first main surface, which is intended to be arranged on the second surface section, and a second main surface, which is situated opposite the first main surface, and wherein, in the non-mounted state of the submodule, a first main surface of the connection section is at a first distance from the second main surface of the housing section in the housing region of a fastening device for mounting the housing section on the second surface section of the cooling device. The invention likewise presents a method for mounting a submodule of this kind on a cooling device.

According to another aspect of the present invention, one object is achieved by a power electronics submodule for mounting on a cooling device, which has a first and a second surface section which are arranged next to one another, comprising a substrate, comprising a housing and comprising a connection element, which is electrically conductively connected by way of a contact section to a conductor track of the substrate and has a connection section, which is arranged parallel to the substrate, wherein the substrate is intended to be arranged by way of a first main surface on the first surface section, wherein the housing has a housing section, which has a first main surface, which is intended to be arranged on the second surface section, and a second main surface, which is situated opposite the first main surface, and wherein, in the non-mounted state of the submodule, a first main surface of the connection section is at a first distance from the second main surface of the housing section in the housing region of a fastening device for mounting the housing section on the second surface section of the cooling device.

After the power electronics submodule is mounted, in particular on a cooling device, the first main surface of the connection section rests on the second main surface of the housing section or is at a distance from it smaller than the first distance, in the housing region of the fastening device. In this way, pressure is exerted onto the contact section, as a result of which the thermal connection of the substrate to the cooling device in the region of the connection of this contact section to a conductor track of the substrate is improved. In this way, this region, and therefore the connection element itself, are cooled better.

Here, the term "parallel to the substrate" is not intended to be understood mathematically precisely, but rather an angle of 10°, or at least an angle of 5°, between the connection section and the substrate is also explicitly included here.

For this purpose, it is advantageous if the connection element is designed as a flat shaped metal body with at least one angled portion and this angled portion, or better a plurality of angled portions, is/are designed in such a way that an angle is formed between the connection section and the substrate.

In addition, or as an alternative, it may be preferred if the housing section has, in the region of its second main surface, a deformation element which interacts with the connection section and defines the first distance.

Here, the connection section may have a pressure element which is intended to deform the deformation element during mounting of the submodule.

For this purpose, the pressure element may project from the first main surface of the connection section. This deformation element is advantageously of a cylindrical or frustoconical design. Here, it is furthermore advantageous if a base of the deformation element is arranged in a depression starting from the second main surface of the housing section.

In principle, the fastening device may be designed as a screw-, rivet- or a clamping-type fastening device.

According to the invention, the abovementioned object is furthermore achieved by a method for arranging a submodule on a cooling device as described above, comprising the following steps:
 a) providing the submodule and the cooling device with a first and a second surface section, which lie in one plane and do not overlap;
 b) placing the submodule on the cooling device, wherein the first main surface of the substrate comes to rest on the first surface section and wherein the first main surface of the housing section of the housing of the submodule comes to rest on the second surface section, wherein the first main surface of the connection section is at a second distance from the second surface section of the cooling device;
 c) attaching a fastening device;
 d) forming a clamping connection between the connection section and the cooling device, wherein, after the clamping connection is formed, the first main surface of the connection section is at a third distance from the second surface section, which third distance is smaller than the second distance.

It is customary in the art that a layer of a thermally conductive substance, in particular a thermally conductive paste, may be arranged between the main surface of the substrate and the first surface section.

As part of method step d), the contact section is preferably pressed onto the substrate and the said substrate is pressed onto the first surface section of the cooling device.

It may be preferred if a section of the second main surface of the housing section forms an abutment on which an associated subsection of the connection section is supported during method step d), and therefore exerts pressure onto the substrate by means of the contact section.

It is particularly advantageous if a deformation element of the housing section is deformed by a pressure element of the connection section. Here, it may be advantageous if the deformation element protrudes beyond the second main surface of the housing section and has a base, which is arranged in a depression of the second main surface of the housing section, wherein this base is partially or completely deformed into this depression during method step d).

It goes without saying that the features, in particular the connection element, which are referred to in the singular can be present multiple times in the submodule according to the invention, unless this is explicitly precluded or precluded per se or is inconsistent with the concept of the invention. Individual method steps can likewise be present multiple times in the method according to the invention or its procedure.

It is intended to be understood that the different refinements of the invention, irrespective of whether they are disclosed as part of the description of the submodule or of the method, can be realized individually or in any desired combinations in order to achieve improvements. In particular, the features mentioned and explained above and hereinafter can be used not only in the combinations indicated, but also in other combinations or by themselves, without departing from the scope of the present invention.

The above and other alternative aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
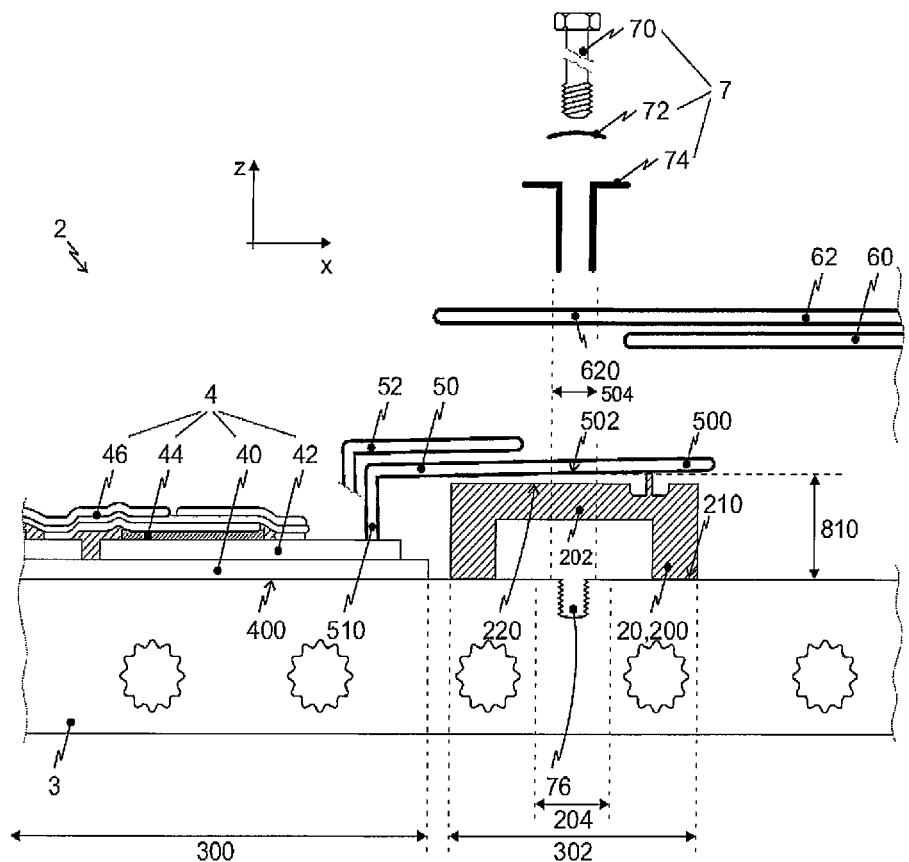
FIG. 1 shows, in part, an exploded illustration of a first refinement of a power electronics submodule according to the invention in the non-mounted state and also a cooling device.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar teams do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Although only a few embodiments have been disclosed in detail above, other embodiments are possible, and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

Figure 2:
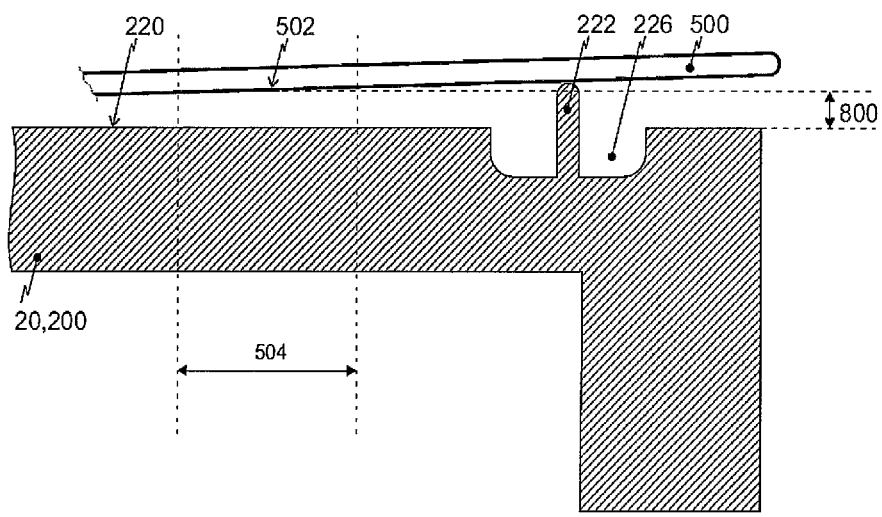
FIG. 2 shows a detail from FIG. 1.

FIG. 1 shows, in part, an exploded illustration of a first refinement of a power electronics submodule 2 according to the invention in the non-mounted state and also a cooling device 3, here configured as a liquid cooling device. FIG. 2 shows a detail of this illustration. A substrate 4 of the submodule 2 is arranged on a first surface section 300 of this cooling device 3. This substrate 4 is designed in a manner customary in the art with an insulating material body 40 and conductor tracks 42 arranged on it. A power semiconductor component 44 is arranged on one of these conductor tracks 42 and connected in a circuit-conforming manner by means of an internal connecting device 46. This connecting device 46 is designed as a foil composite which is likewise customary in the art.

Figure 8:
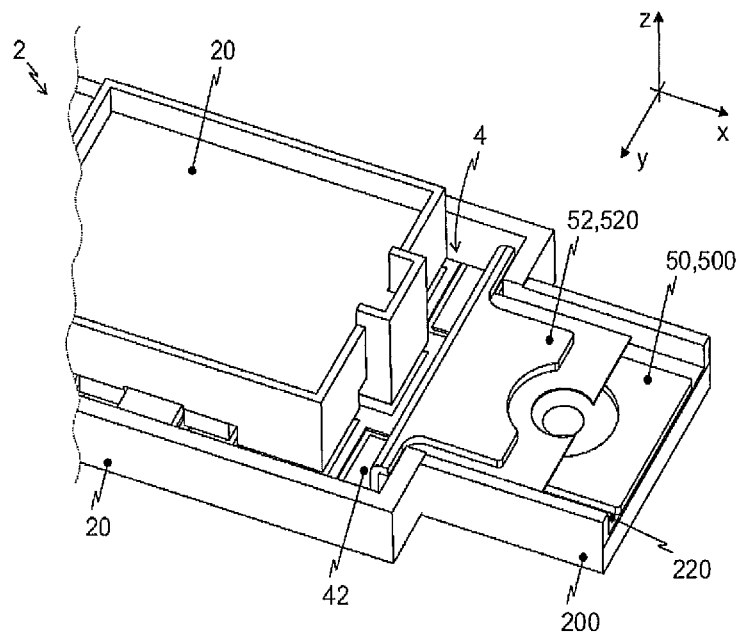
FIG. 8 shows a three-dimensional view of a portion of a submodule.

A housing section 200 of a housing 20, otherwise not illustrated here, cf. FIG. 8 by way of example, is arranged on a second surface section 302 of the cooling device 3 arranged next to the first surface section. The housing 20 as such may enclose the entire submodule 200, but may also be designed only as a part-housing and may also be of a multipartite design.

The housing section 200 has a first main section 210, which is arranged on the second surface section 302, and also a second main surface 220, which is situated opposite the first main surface and oriented parallel thereto. In addition, the housing section 200 has a clearance 202, which passes through from the second main surface to the first main surface, for arrangement of a fastening device 7, or a portion thereof.

A connection element 50, here more specifically a first DC load connection element, which is designed as a flat shaped metal body, has a contact section 510, which is electrically conductively connected to a conductor track 42 of the substrate 4, and a connection section 500. The connection section 500 has a clearance 504, which is in alignment with the clearance 202 of the housing section 200. During mounting, a portion of a fastening device 7 is arranged in this clearance 504. A second DC load connection element 52 is further arranged parallel to the first DC load connection element here. The two DC load connection elements 50, 52 together form the electrical connection to a capacitor 6, cf. FIG. 9, the connection elements 60, 62 of which are likewise illustrated here. The DC load connection elements 50, 52 are connected in a circuit-conforming manner to these capacitor connection elements 60, 62 by means of the fastening device 7.

Here, this fastening device 7 is designed as a screw 70, which engages into a clearance 76 of the cooling device 3, which clearance is provided with a thread. For reasons of electrical insulation, an insulating material body 74 for arrangement in the clearances is further provided here, where necessary. Furthermore, a spring element 72, here a plate spring, is provided for permanent and constant introduction of pressure.

According to the invention, in the non-mounted state of the submodule 2, a first main surface 502 of the connection section 500, facing the cooling device 3 and the housing section 200, is at a first distance 800 from the second main surface 220 of the housing section 200 in the housing region 204 of the fastening device 7. The housing region 204 of the fastening device 7 is determined by the clearance 202 of the housing section 200 and its immediate environment.

For arranging the submodule 2 on the cooling device 3, a second distance 810 is produced between the first main surface 502 of the connection section 500 of the connection element 50 in that housing region 204 which is associated with the fastening device 7.

In order to form this first distance 800, and respectively also the second distance 810, in a reliable manner, the housing section 200 has, in the region starting here from its second main surface 220, a deformation element 222, which interacts with the connection section 500. This deformation element 222 substantially has a cylindrical shape, wherein the base of the deformation element 222 is arranged in a depression 226 of the second main surface 220 of the housing section 200. This creates an angle, illustrated in an exaggerated manner for reasons of clarity, between the plane of the substrate 4, more specifically its first main surface 400, and that of the first main surface 502 of the connection section 500 of the connection element 50.

Figure 3:
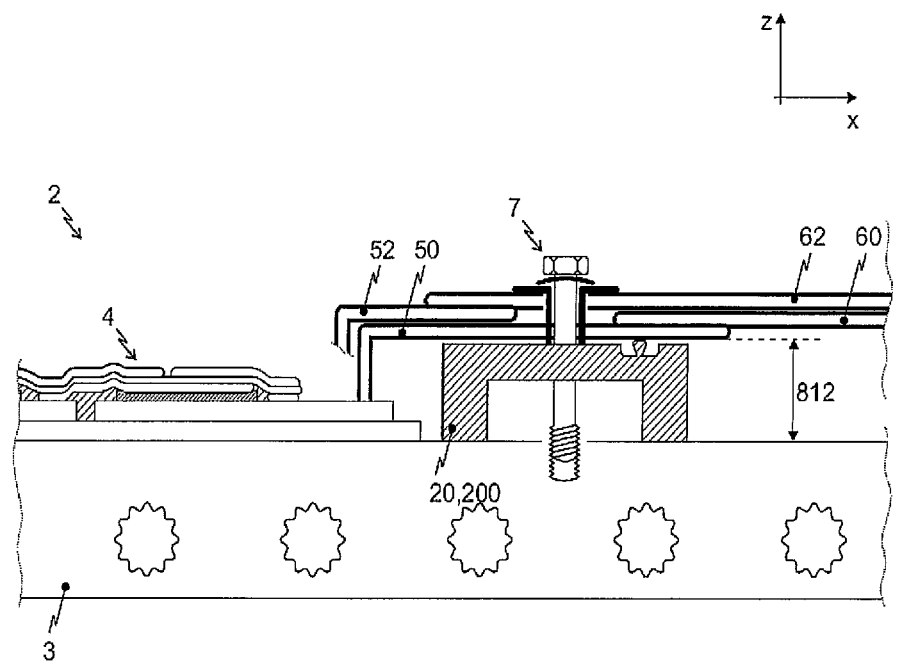
FIG. 3 shows, in part, the first refinement of the power electronics submodule according to the invention mounted on a cooling device.
Figure 4:
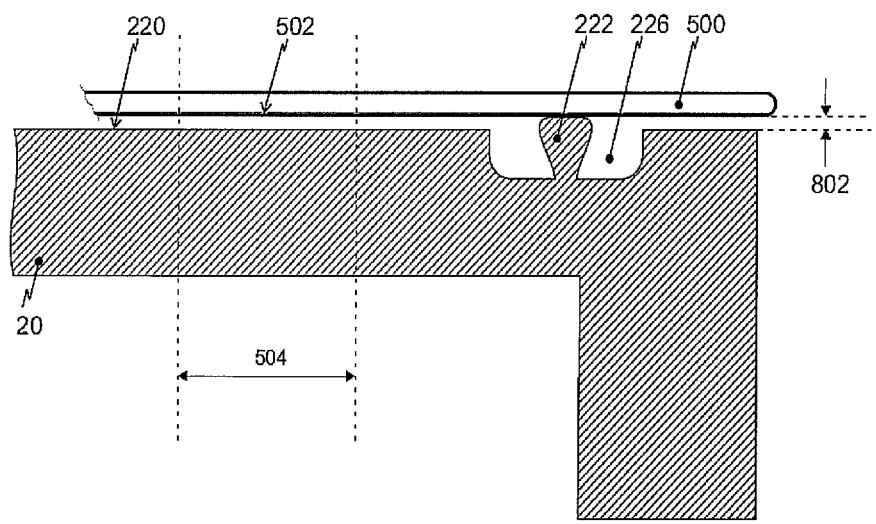
FIG. 4 shows a detail from FIG. 3.

FIG. 3 shows, in part, the first refinement of a power electronics submodule 2 according to the invention mounted on a cooling device 3. FIG. 4 shows a detail thereof. The result of execution of the method for arranging the submodule 2 on a cooling device 3 is therefore illustrated here.

By virtue of the screw 70 of the fastening device 7 being screwed into the thread of the clearance 76 of the cooling device 3, a portion of the connection section 500 has deformed the deformation element 222 in such a way that it has been deformed virtually completely into the depression of the housing section. In this way, the distance between the first main surface 502 of the connection section 500 and the second main surface of the housing section 200 in the housing region 204 of the fastening device 7 is significantly reduced in comparison with the first distance.

The connection element 500 advantageously rests, by way of its first main surface 502, on the second main surface 220 of the housing section 200, as a result of which the distance between the two becomes zero, as far as is technically feasible.

The second distance 810 of the non-mounted arrangement is likewise reduced, as a result of which a third distance 812, which is smaller than the second distance, is produced.

Figure 5:
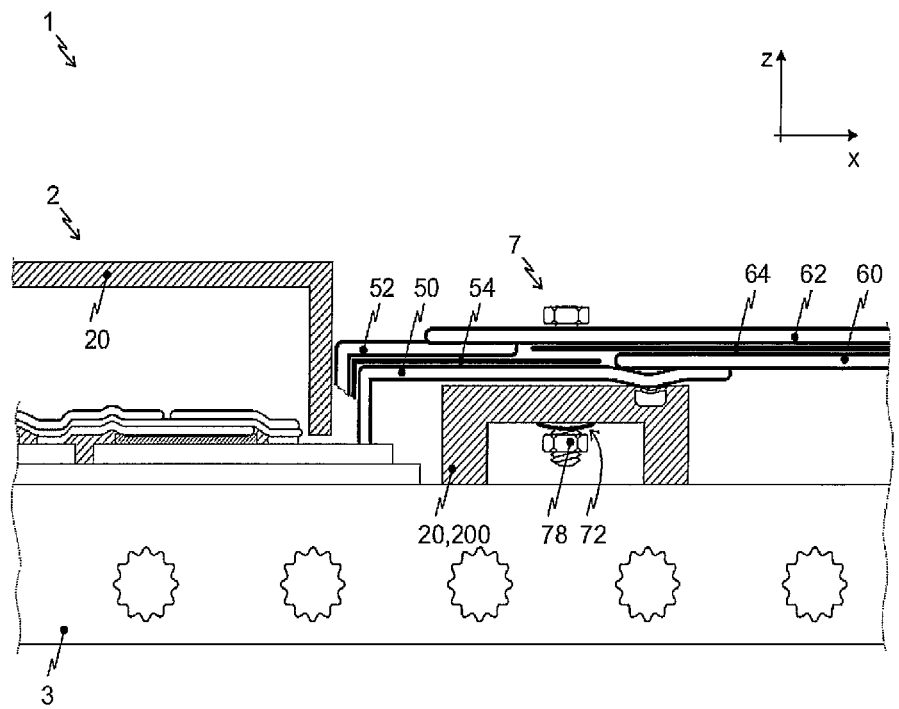
FIG. 5 shows, in part, a second refinement of a power electronics submodule according to the invention mounted on a cooling device.
Figure 6:
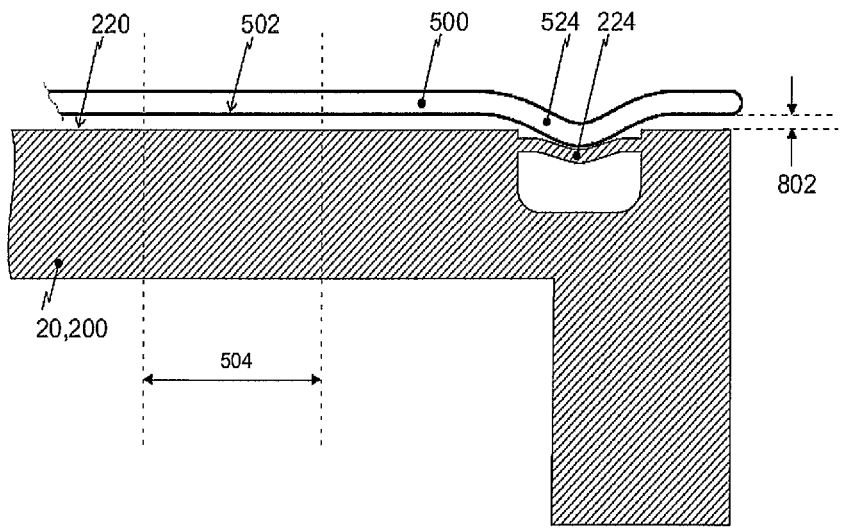
FIG. 6 shows a detail from FIG. 5.

FIG. 5 shows, in part, a second refinement of a power electronics submodule 2 according to the invention mounted on a cooling device 3. FIG. 6 shows a detail thereof. In this refinement, the fastening device 7 is, in principle, similar to that according to FIGS. 1 and 3, but here the abutment of the screw is a screw nut 78, which is not part of the cooling device.

A further difference from the arrangements according to FIGS. 1 and 3 relates to the deformation element 224, which is designed here as a web, arranged in a depression of the housing section 200 and parallel to its second main surface 220. Here, the connection section 500 has a pronounced pressure element 524, which is intended to deform the deformation element 224 during mounting of the submodule 2, as illustrated here.

In addition, a further portion of the housing 20 is further illustrated here. All other components correspond to those of FIGS. 1 to 4.

Figure 7:
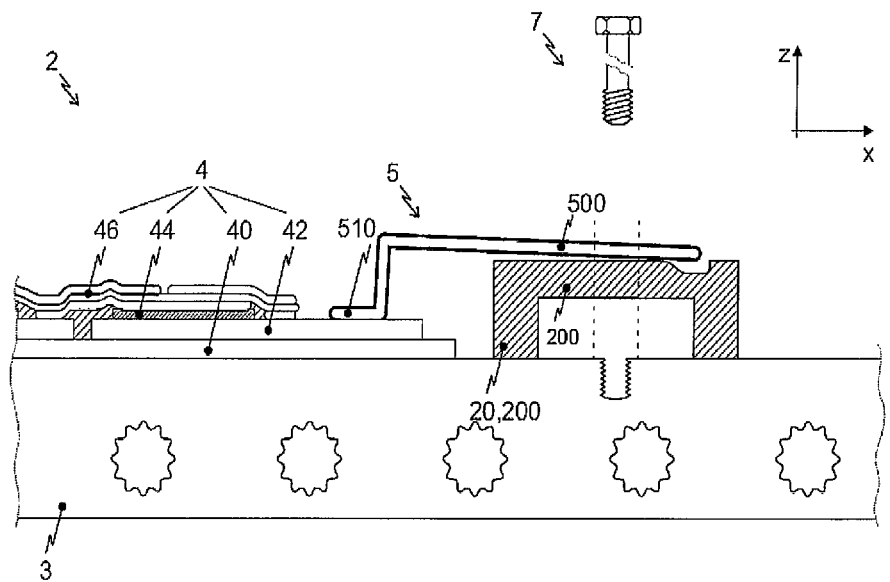
FIG. 7 shows, in part, a third refinement of a power electronics submodule according to the invention mounted on a cooling device.

FIG. 7 shows, in part, a third refinement of a power electronics submodule 2 according to the invention mounted on a cooling device 3. Said figure once again illustrates a cooling device 3 and a substrate 4 as already described above. However, here, the connection element 500 has a contact section 510, the one bottom section parallel to the substrate 4, specifically its first main surface 400. Here, the entire connection element 5 has two angled portions, owing to which the connection section 500 has an inclined profile in the direction of the cooling device 3. This inclined profile is not assisted by any deformation element here. The end of the connection section 500 is additionally located in a depression of the housing section 200, starting from its second main surface 220.

During mounting, the screw 70, as described above, is screwed into the thread of the clearance 76 of the cooling device 3. Owing to the force occurring in the housing region 204 of the fastening device 7, the connection section 500 is pressed in the direction of the second main surface 220 of the housing section 200 and therefore also in the direction of the cooling device 3. At the same time, pressure is produced on the connecting section 510 of the connection element 50 and presses this onto the substrate 4 and this onto the cooling device 3. Therefore, excellent heat transfer which cools the entire connection element 5 during operation is provided here.

FIG. 8 shows a three-dimensional view of a portion of a submodule 2, wherein the above-described details are illustrated once again in an explanatory manner here. Here, the housing 20 has a plurality of part-housings which are not directly connected to one another.

Figure 9:
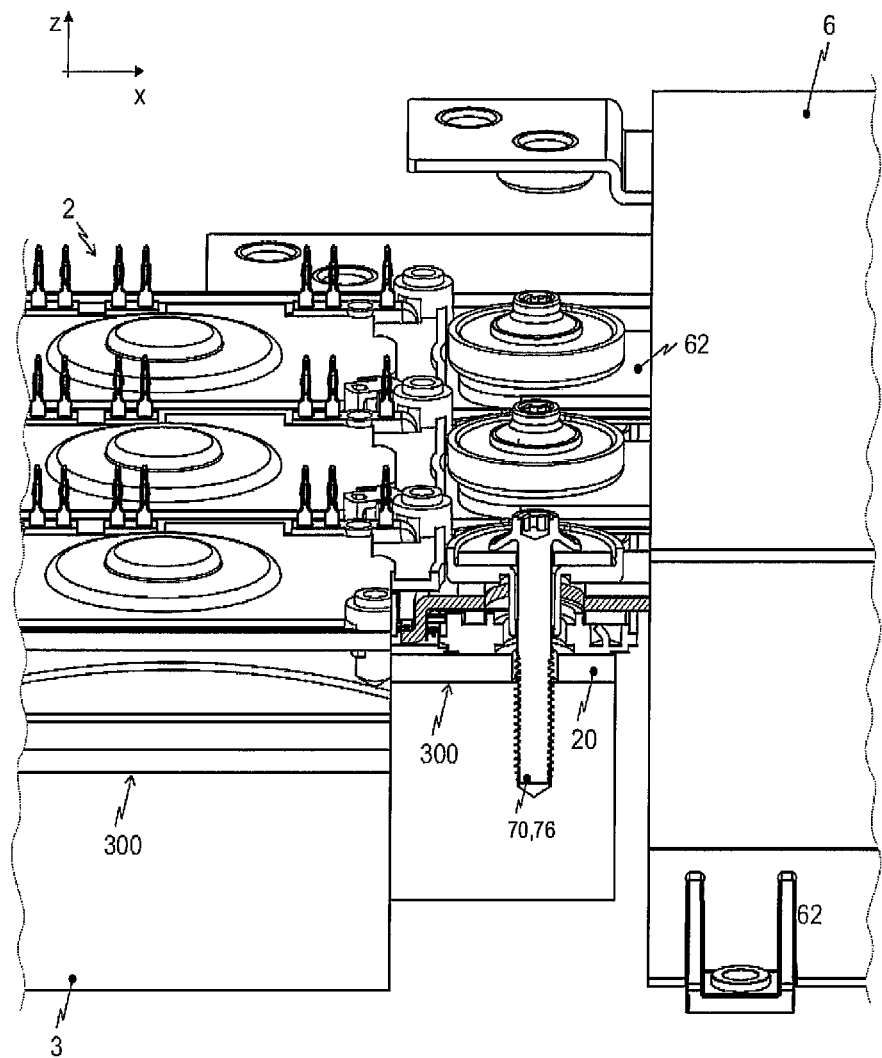
FIG. 9 shows a three-dimensional view of three submodules according to the invention mounted on a cooling device.

FIG. 9 shows a three-dimensional view of three submodules 2 according to the invention mounted on a cooling device 3 in a three-dimensional sectional view. A capacitor 6 is additionally illustrated here. Within the scope of the method according to the invention, the connection elements 60, 62 of the capacitor 6 were additionally connected in a circuit-conforming manner to the connection elements 50, 52 of the submodules 2.

Also, the inventors intend that only those claims, if any, which use the words "means for" are intended to be interpreted under 35 USC 112. Moreover, no limitations from the specification are intended to be read into any claims, unless those limitations are expressly included in the claims.

Where a specific numerical value is mentioned herein, it should be considered that the values may be increased or decreased by 20%, while still staying within the teachings of the present application, unless some different range is specifically mentioned. Where a specified logical description is used, these would be understood within those of skill in this particular art.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronics submodule, for mounting on a cooling device, which has a first and a second surface section which are arranged next to one another, comprising:
   a substrate, further comprising:
      a housing and at least one connection element, which is electrically conductively connected by way of a contact section to a conductor track of the substrate and has a connection section, which is arranged parallel to the substrate;
   wherein the substrate is arranged on a first main surface on the first surface section;
   wherein the housing has a housing section, which has a first housing main surface, which is intended to be arranged on the second surface section, and a second housing main surface, which is situated opposite the housing first main surface;
   wherein, in a non-mounted state of the submodule, a first connection main surface of the connection section is at a first distance from the second housing main surface of the housing section in the housing region of a fastening device for mounting the housing section on the second surface section of the cooling device; and
   the housing section has, in the region of its second housing main surface, a deformation element which interacts with the connection section and defines the first distance.

2. The submodule according to claim 1, wherein:
the at least one connection element is designed as a flat shaped metal body with at least one angled portion.

3. The submodule according to claim 1, wherein:
the connection section has a pressure element, which is intended to deform the deformation element during mounting of the submodule.

4. The submodule according to claim 3, wherein:
the pressure element projects from the first connection main surface of the connection section.

5. The submodule according to claim 4, wherein:
the deformation element has one of a cylindrical and a frustoconical design.

6. The submodule according to claim 5, wherein:
a base of the deformation element is arranged in a depression starting from the second housing main surface of the housing section.

7. The submodule according to claim 1, wherein:
the fastening device is designed as one of a screw-, a rivet- and a clamping-type fastening device.

8. A method for arranging a power electronics submodule on a cooling device according to claim 1, comprising the following steps:
   a) providing the submodule and the cooling device with a first and a second surface section, which lie in one plane and do not overlap;
   b) placing the submodule on the cooling device, wherein the first main surface of the substrate comes to rest on the first surface section and wherein the first housing main surface of the housing section of the housing of the submodule comes to rest on the second surface section, wherein the first connection main surface of the connection section is at a second distance from the second surface section of the cooling device;
   c) attaching a fastening device;
   d) forming a clamping connection between the connection section and the cooling device, wherein, after the clamping connection is formed, the first connection main surface of the connection section is at a third distance from the second surface section, and third distance is smaller than the second distance; and
   wherein a deformation element of the housing section is deformed by a pressure element of the connection section.

9. The method according to claim 8, wherein:
as part of method step d), the contact section is pressed onto the substrate and the said substrate is pressed onto the first surface section of the cooling device.

10. The method according to claim 8, wherein:
a section of the second housing main surface of the housing section forms an abutment on which an associated subsection of the connection section is supported during said method step d), and therefore exerts pressure onto the substrate by means of the contact section.

11. The method according to claim 9, wherein:
the deformation element protrudes beyond the second housing main surface of the housing section and has a base, which is arranged in a depression of the second housing main surface of the housing section, wherein the base is one of partially or completely deformed into the depression during said method step d).

* * * * *